United States Patent [19]

Kandpal

[11] Patent Number: 4,806,891
[45] Date of Patent: Feb. 21, 1989

[54] BROADBAND SIGNAL FREQUENCY MULTIPLIER APPARATUS USING DIELECTRIC RESONATOR MEANS

[75] Inventor: Pramode C. Kandpal, Richardson, Tex.

[73] Assignee: Rockwell International Corporation, El Segundo, Calif.

[21] Appl. No.: 166,860

[22] Filed: Mar. 11, 1988

[51] Int. Cl.[4] .............................................. H01P 1/20
[52] U.S. Cl. .................................. 333/218; 333/219.1
[58] Field of Search ............................. 333/218, 219.1

[56] References Cited

U.S. PATENT DOCUMENTS 3,621,367 11/1971 Rosen et al. ....................... 333/218
4,673,895 6/1987 Tadachi et al. ............... 333/219.1 X

FOREIGN PATENT DOCUMENTS 2153598 8/1985 United Kingdom ............. 333/219.1

Primary Examiner—Paul Gensler
Attorney, Agent, or Firm—Bruce C. Lutz; V. Lawrence Sewell; H. Fredrick Hamann

[57] ABSTRACT

A frequency multiplier circuit is created by using a step recovery diode along with its signal source and reactive circuit to produce a comb of frequencies. This comb of frequencies is then applied to a dielectric resonator circuit for filtering all but the desired harmonic of the source. Correct positioning of the dielectric resonator on its parallel positioned input and output transmission lines, can be used to affect the phase of reflected signals to further enhance the signals which are reflected back to the step recovery diode thereby increasing the efficiency or further generation of harmonics of the desired frequency applied to the dielectric resonator and thus, output by the multiplier circuit. The multiplier frequency obtained is determined by the natural resonant frequency of the dielectric resonator chosen thereby providing a basic device which can be used as a source for many different output frequencies.

7 Claims, 2 Drawing Sheets 4,806,891

BROADBAND SIGNAL FREQUENCY MULTIPLIER APPARATUS USING DIELECTRIC RESONATOR MEANS

THE INVENTION

The present invention is related generally to multiplying circuits and more specifically to a circuit using microstrip techniques in conjunction with a dielectric resonator element for providing the selection of a single harmonic from a comb of supplied frequency components.

BACKGROUND

The prior art approach to produce signal multiplication has been to apply a signal of a given frequency to a comb generator and select one frequency component from the comb generated signal using a mechanical cavity or some type of electronic filter. Generally, the filter or cavities needed to be specifically designed for a given frequency and thus, they not only used a large amount of chip or circuit board area but they were additionally not readily modifiable for use in selecting other frequencies.

The present invention obtains or provides the filtering action by using a dielectric resonator to couple a given frequency from one transmission line to the other in connection with the application of the comb of frequencies to one of the two coupled transmission lines. The natural or resonant frequency of the resonator determines the frequency of the signal to be output from the second transmission line. The efficiency of the circuit can be maximized by adjusting the distance of the resonator from the beginning of the transmission line such that the energy of a majority of the frequency components are returned to the comb generator source in a manner such that more components of the desired frequency are generated. The maximum output can be further adjusted by selecting or modifying the distance between the resonator element and the transmission lines so as to affect the coupling.

To obtain a multiplier having a different frequency multiplication, the only alteration that needs to be made is to select a dielectric resonator having a different natural frequency.

It is thus an object of the present invention to provide a simple, space efficient signal frequency multiplier wherein the value of frequency multiplication can easily be altered for other applications.

Other objects and advantages of the present invention will be apparent from a reading of the specification and appended claims in conjunction with the drawings wherein:

FIG. 4 is a typical spectrum display of a comb generator such as used in the present invention and which spectrum of frequencies would be contained in the signal waveform of FIG. 3a.

DETAILED DESCRIPTION

Figure 1:
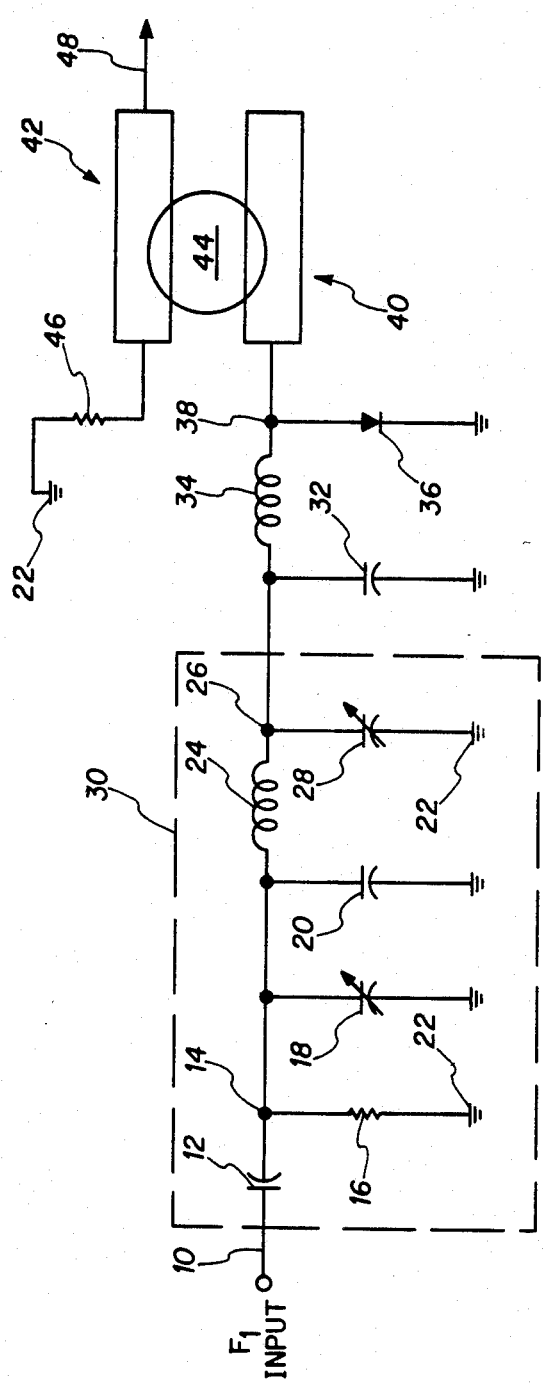
FIG. 1 is a circuit diagram of one embodiment of the inventive concept.

In FIG. 1 a sine wave signal F1 is input on lead 10 and passed through a capacitor 12 to a junction point 14. A resistor 16 and a variable capacitor 18 along with a fixed capacitor 20 are all connected in parallel between junction point 14 and ground 22. A coil or inductance 24 is connected between junction point 14 and a junction point 26. A further variable capacitor 28 is connected between junction point 26 and ground 22. The components 12 through 28 constitute an impedance matching circuit and is designated as dash line block 30. A capacitor 32 is also connected between junction point 26 and ground 22, although outside the box 30, since it actually constitutes a part of a comb generating circuit comprising in addition an inductance 34 and a step recovery diode 36 connected as shown. A junction point 38 between the inductance 34 and the step recovery diode 36 provides an input to a first microstrip transmission line generally designated as 40 which is coupled to a second transmission line 42 by a dielectric resonator generally designated as 44. A resistor 46 is connected between ground 22 and an input of microstrip transmission line 42. Microstrip transmission line 42 has a signal output lead 48.

Figure 2:
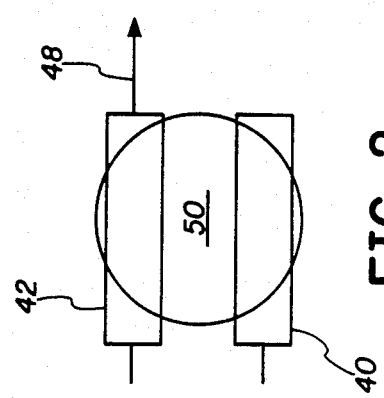
FIG. 2 is an illustration of the dielectric resonator and transmission line portion of FIG. 1 wherein a lower frequency (larger diameter) dielectric element is used for the coupling process.

In FIG. 2 a portion is shown of FIG. 1 which illustrates the only change necessary in FIG. 1 to obtain a different output frequency from the circuit of FIG. 1. In FIG. 2 the identical components such as transmission lines 40 and 42 and the output 48 are numbered identically while a physically different size dielectric resonator is given the general designation 50. If the rest of the parameters remain the same, a dielectric resonator resonates at lower frequencies as a function of increases in diameter. Thus, using the larger diameter disk 50 in place of the original disk 44 of FIG. 1, will produce a multiplier having a lower output frequency.

Figure 3:
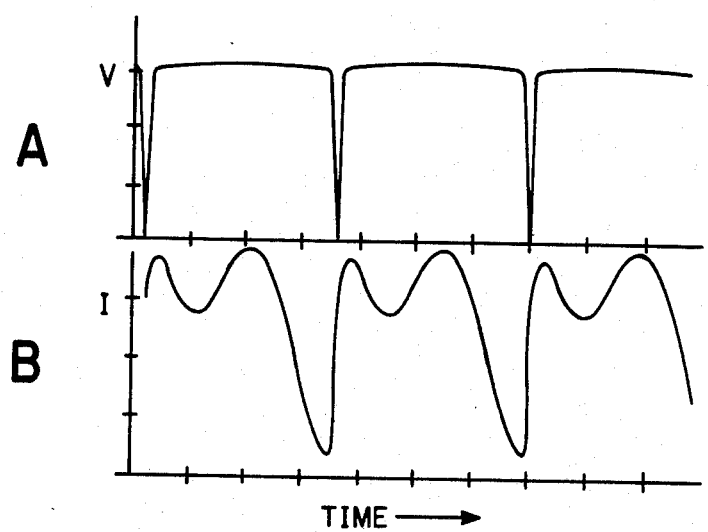
FIG. 3a illustrates the voltage waveform of a sine wave signal as applied to the step recovery diode of FIG. 1.
FIG. 3b is a current waveform of the signal applied to the step recovery diode.

In FIG. 3a a waveform is shown indicative of the voltage across diode 36 of FIG. 1. Waveform FIG. 3b is indicative of the current passing through the diode 36.

Figure 4:
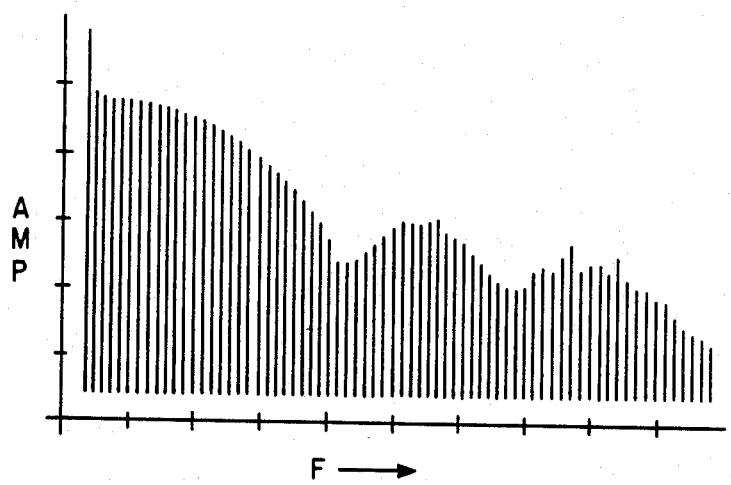

The waveform spectrum of the signals of FIG. 3a or 3b are illustrated in FIG. 4 with the leftmost vertical line being the base frequency and the remaining lines to the right indicating the subsequent harmonics of the base frequency and their relative amplitudes for one embodiment of a comb generator. From this presentation in FIG. 4, it may be ascertained that a single comb generator produces components of many different frequencies from a single base frequency sine wave signal. The number of harmonics of discernable amplitude that are obtained are a function of the steepness of the pulse of FIG. 3a.

OPERATION

A sine wave signal is applied at the input 10 of FIG. 1 and after passing through the matching circuit is applied to the step recovery diode 36. The resistor 16 in the matching circuit 30 provides a DC path for diode currents to flow.

The transmission line element 40 acts as an open-ended transmission line wherein the energy of signals which reach the end are reflected back to the source. The resonator 44 also acts to reflect some of the signals which have a frequency other than the resonant frequency of the resonator 44. The position from beginning to end of the dielectric resonator 44, as compared to the length of the transmission line element 40, affects the phase at which the harmonic signals are returned to the source diode 36. By adjusting the dielectric resonator from left to right, a point of maximum coupling may be ascertained by measuring the power output from lead 48. The dielectric resonator only couples the signals from transmission element 40 to 42 that occur at the natural resonant frequency of element 44. However, by adjusting the position of element 44 from left to right on transmission line 40, the signals can be reflected in such a manner as to contribute energy to the desired frequency when received by the step recovery diode 36.

For the most efficient design, the original circuit used a spacing between the transmission elements 40 and 42 such that their center lines were a distance apart equal to the diameter of the highest frequency dielectric resonator to be used in the circuit. The dielectric element 44 is shown as being slightly less than the distance between center lines of transmission elements 40 and 42 since the coupling will still take place but merely not be as efficient as if the element 44 were at least a diameter equal to the distance between center lines of transmission lines 40 and 42.

To obtain lower frequencies at the output 48, the dielectric element 44 is replaced by a different dielectric resonator. An example is shown in FIG. 2 where element 50 is of a much larger diameter and is placed in a different horizontal position with respect to the beginning and end of transmission element 40 to maximize the output at 48.

In one embodiment of the invention, the element 44 provided an eighteen gigahertz output frequency with a one gigahertz sine wave applied at F1. The embodiment shown in FIG. 2 provided a ten gigahertz output with the only change being the dielectric elements 44 being replaced by element 50. Dielectric resonator elements can be obtained from many sources, one source is from a company by the name of muRata Erie, North America, Inc.

Although typically the dielectric resonators would be juxtaposed the transmission line elements as close as possible for maximum output, the resonators can be spaced from the transmission lines 40 and 42 to adjust the amplitude of the output to some lesser value.

If further line tuning of the resonant frequency output signal amplitude is required after the resonator is attached to the transmission lines, any of several prior art approaches may be used such as a tuning screw. Such fine tuning would typically be preferable to removing and reattaching the resonator in a more nearly correct signal amplitude position.

As previously indicated, the prior art approach has been to design a different cavity or other signal discrimination means for each different output frequency to be obtained from a given generalized type of circuit. The present invention is able to use the circuit in its identical format for each of many different harmonic frequencies by merely selecting a different dielectric resonator and positioning it across the two transmission lines for appropriate coupling and phasing to obtain different output frequencies. This greatly simplifies the design of a signal multiplier as well as drastically reducing the space required for same.

I thus wish to claim:

1. Signal frequency multiplier apparatus comprising, in combination:
   circuit mounting means;
   first and second transmission line means attached to said circuit mounting means and spaced Y units apart;
   dielectric resonator means, having a diameter of at least Y attached to said mounting means, juxtaposed both said first and second transmission line means;
   signal input means, connected to said first transmission line means, for supplying a signal having a plurality of frequencies; and
   signal output means, connected to said second transmission line means, for providing an output signal of substantially only one of said plurality of frequencies.

2. Apparatus as claimed in claim 1 wherein:
   said transmission line means are constructed in accordance with microstrip technology; and
   said circuit mounting means comprises a dielectric circuit board.

3. Apparatus as claimed in claim 1 wherein said signal input means includes a comb generating means comprising a step recovery diode which is actuated by a signal of a first frequency which is a subharmonic of the output of said signal output means.

4. The method of obtaining signal frequency multiplication comprising the steps of:
   applying an impulse train waveform first signal of a base frequency which first signal has a plurality of harmonics to a first transmission line;
   coupling a harmonic of said first signal to a second transmission line through the use of a tank circuit including a dielectric resonator where the resonator has a resonance at a second frequency which is a multiple of said base frequency; and
   outputting signals of said second frequency from said second transmission line.

5. The method of claim 4 comprising the additional step of adjusting the distance of the resonator from the beginning of the first transmission line whereby the phases of the signal result in maximizing the power output at said second frequency from said second transmission line.

6. Signal frequency multiplication apparatus comprising, in combination:
   open-ended transmission line first means having an imaginary centerline;
   transmission line second means, also having an imaginary centerline, positioned parallel to said transmission line first means where the two centerlines are a distance Y apart;
   dielectric resonator third means having a diameter no less than Y juxtaposed said transmission line first and second means and centered with respect to the position of said transmission line first and second means; and
   signal supplying fourth means, connected to said first means, for resonantly supplying a signal comprising a comb of frequencies as generated from a sine wave where the comb of frequencies includes the frequency of the desired output signal from the apparatus, the third means acting as a filter to couple only the desired frequency signal to said second means.

7. Signal frequency multiplication apparatus comprising, in combination:
   open-ended transmission line first means;
   comb frequency generating signal supplying second means including step recovery diode means;

transmission line third means situated parallel to said first means in a manner such that their centerlines are a distance Y apart, said third means including frequency multiplied signal output means; and dielectric resonator disk fourth means, having a diameter of at least Y, attached to and juxtaposed said first and third means whereby there is substantially equal coupling between said fourth means and each of said first and third means, said fourth means coupling substantially only a single frequency signal, out of a comb of frequencies supplied to said first means by said second means, to said third means.

* * * * *